(12) United States Patent
Tung et al.

(10) Patent No.: US 11,747,301 B2
(45) Date of Patent: Sep. 5, 2023

(54) MAGNETIC FIELD STRUCTURE

(71) Applicant: Industrial Technology Research Institute, Hsinchu (TW)

(72) Inventors: Mean-Jue Tung, Hsinchu (TW); Shi-Yuan Tong, Hsinchu (TW); Yu-Ting Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 41 days.

(21) Appl. No.: 17/551,799

(22) Filed: Dec. 15, 2021

(65) Prior Publication Data
US 2022/0196598 A1    Jun. 23, 2022

(30) Foreign Application Priority Data

Dec. 22, 2020  (TW) ................................. 109145600

(51) Int. Cl.
*G01N 27/72*       (2006.01)
*G01B 11/14*       (2006.01)

(52) U.S. Cl.
CPC ............. *G01N 27/72* (2013.01); *G01B 11/14* (2013.01)

(58) Field of Classification Search
CPC ........ G01N 27/72; G01B 11/14; G01B 11/00; G01R 1/07; G01R 31/2891; G01R 33/12; G01R 33/1253; G01R 1/02; G01R 1/28
See application file for complete search history.

(56) References Cited

U.S. PATENT DOCUMENTS

| | | | |
|---|---|---|---|
| 7,872,485 B2 | 1/2011 | Colvin | |
| 8,044,673 B1 | 10/2011 | Burgyan | |
| 2011/0267088 A1 | 11/2011 | Zelder et al. | |
| 2012/0229129 A1* | 9/2012 | Kochergin | G01R 33/1284 356/213 |
| 2017/0018395 A1* | 1/2017 | Yu | H01F 7/204 |
| 2020/0096559 A1 | 3/2020 | Chuang et al. | |
| 2020/0166591 A1 | 5/2020 | Pietig et al. | |

FOREIGN PATENT DOCUMENTS

| | | | | |
|---|---|---|---|---|
| CN | 101876691 A | | 11/2010 | |
| CN | 110940907 A | | 3/2020 | |
| CN | 111766551 A | * | 10/2020 | |
| EP | 2738607 B1 | * | 5/2016 | H01J 37/26 |

(Continued)

OTHER PUBLICATIONS

"Zhou et al. Multi-Field nanoindentation apparatus for measuring local mechanical properties of materials in external magnetic and electric fields" Review of Scientific Instruments 84, 063906 (2013). (Year: 2013).*

*Primary Examiner* — Eman A Alkafawi
*Assistant Examiner* — Dilara Sultana
(74) *Attorney, Agent, or Firm* — Fox Rothschild LLP

(57) ABSTRACT

A magnetic field structure is provided and includes: two magnetic poles disposed in a magnetic circuit path and opposite to one another to form a space therebetween for receiving an element to be tested; a magnetic field source for providing a magnetic field in the space; and an optical positioning element disposed in one of the two magnetic poles for optically positioning the element to be tested. Therefore, the magnetic field structure can simultaneously provide a strong magnetic field and a precise positioning function.

11 Claims, 10 Drawing Sheets

(56) References Cited

FOREIGN PATENT DOCUMENTS

| | | | |
|---|---|---|---|
| JP | 2006196195 A | * | 7/2006 |
| TW | 200300842 A | | 6/2003 |
| TW | 201602607 A | | 1/2016 |
| TW | 201719190 A | | 6/2017 |
| TW | 201743065 A | | 12/2017 |
| TW | 201820667 A | | 6/2018 |
| TW | 201939060 A | | 10/2019 |
| TW | 201939566 A | | 10/2019 |
| TW | 201946086 A | | 12/2019 |
| TW | 202013546 A | | 4/2020 |
| TW | 202016567 A | | 5/2020 |
| WO | 2010/015315 A1 | | 2/2010 |
| WO | 2017/034755 A1 | | 3/2017 |

\* cited by examiner

MAGNETIC FIELD STRUCTURE

CROSS-REFERENCE TO RELATED APPLICATIONS

This Application claims priority to Taiwan Patent Application No. 109145600, filed on Dec. 22, 2020. The entirety of the above-mentioned patent application is hereby incorporated by reference herein and made a part of this specification.

BACKGROUND

1. Technical Field

The present disclosure relates to magnetic field structures, and more particularly, to a magnetic field structure having an optical positioning function.

2. Description of Related Art

With continuous miniaturization of semiconductor elements, electrodes have smaller area and shorter pitch. Further, during an electromagnetic characteristic test, a strong magnetic field must be applied, and electromagnetic characteristic parameters of an element to be tested can be captured by an external probe connected to a measurement instrument. As such, the external probe needs to be precisely positioned so as to effectively carry out magnetic characteristics detection.

Generally, an optical positioning element used for positioning the external probe is disposed over the element to be tested, and a magnetic pole of the strong magnetic field is also disposed over the element to be tested. If positioning the probe and applying the strong magnetic field need to be performed simultaneously, the magnetic pole and the optical positioning element could spatially collide with each other and cannot be used at the same time.

Therefore, solutions are provided as follows. The optical positioning element is obliquely disposed at one side of the magnetic pole. In another way, during positioning of the probe, the magnetic pole is moved away first and then the optical positioning element is moved in. After completing the positioning of the probe, the optical positioning element is moved away and then the magnetic pole is moved in. However, the oblique disposing of the optical positioning element often results in an angular parallax and an optical focusing difficulty, thus hindering precise alignment and leading to time-consuming measurement. Further, the optical positioning element can only import a light source from a small space next to the probe for measurement, thus increasing the difficulty in spatial arrangement. Furthermore, the movement of the magnetic pole and the optical positioning element may generate vibration and hence cause displacement of the probe that is already positioned and further damage fine electrodes on the element to be tested.

SUMMARY

The present disclosure provides a magnetic field structure, which includes: two magnetic poles disposed in a magnetic circuit path and opposite to one another so as to form a space therebetween for receiving an element to be tested; a magnetic field source for providing a magnetic field in the space; and an optical positioning element disposed in one of the two magnetic poles for optically positioning the element to be tested.

DETAILED DESCRIPTION

The following illustrative embodiments are provided to illustrate the present disclosure, these and other advantages and effects can be apparent to those in the art after reading this specification.

Figure 1A:
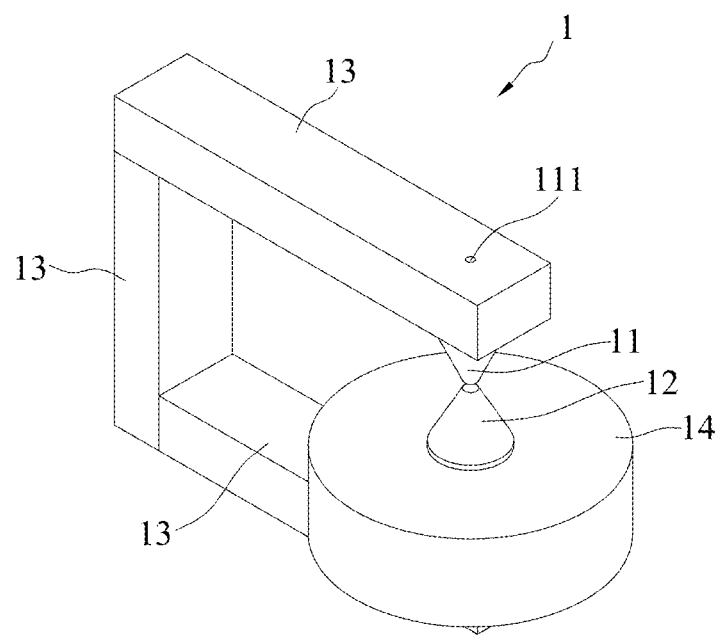
FIG. 1A is a schematic perspective view of a magnetic field structure according to the present disclosure.
Figure 1B:
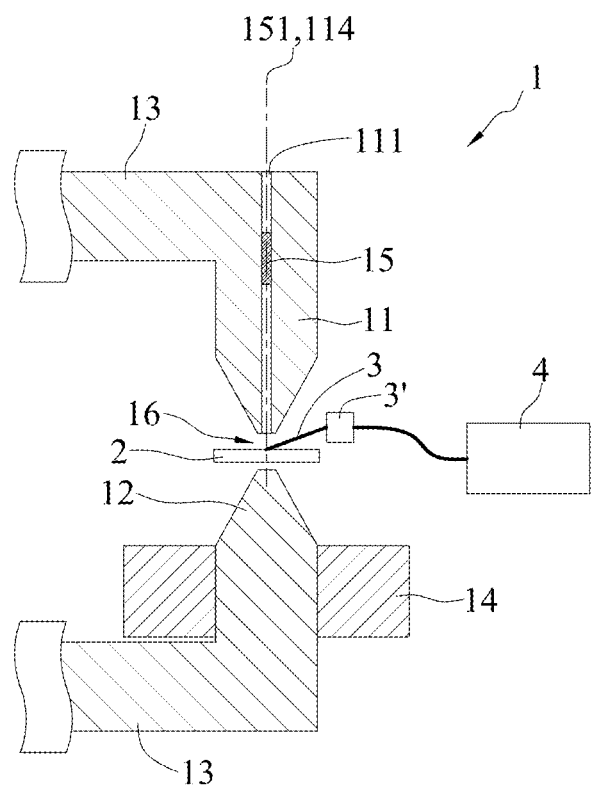
FIG. 1B is a schematic partial cross-sectional view of the magnetic field structure of FIG. 1A.

Referring to FIGS. 1A and 1B, a magnetic field structure 1 according to the present disclosure has magnetic poles 11, 12, a magnetic circuit path 13, a magnetic field source, and an optical positioning element 15. The magnetic poles 11, 12 are disposed in two ends of the magnetic circuit path 13 and opposite to one another. As such, a space 16 is formed between the magnetic poles 11, 12 for receiving an element 2 to be tested.

In an embodiment, the magnetic poles 11, 12 can be conical. For example, the magnetic poles 11, 12 can have a diameter gradually decreasing from 60 mm to 10 mm. Alternatively, referring to FIGS. 2A and 2B, the magnetic poles 11, 12 can be a combination of a cylindrical portion (having a diameter D1 of 60 mm) and a conical portion close to one end of the element 2 to be tested (decreasing from a diameter D1 of 60 mm to a diameter D2 of 10 mm), thereby concentrating magnetic flux lines and strengthening the magnetic field (however, the present disclosure is not limited thereto).

The magnetic field source is used to provide a magnetic field in the space 16. In an embodiment, the magnetic field source can be, for example, an electromagnetic field generated when current flows through a coil 14 around the magnetic pole 12. In other embodiments, the magnetic field source can be a permanent magnetic field generated by a permanent magnet (the present disclosure is not limited thereto). After the magnetic field is generated in the space 16, the electromagnetic characteristic parameters of the element 2 to be tested can be captured by a probe 3, a probe base 3' and a measurement instrument 4.

The optical positioning element 15 can be disposed in one of the magnetic poles 11, 12 for optically positioning the element 2 to be tested. For example, in the following illustration, the optical positioning element 15 is disposed in the magnetic pole 11. But it should be noted that the optical positioning element 15 can be alternatively disposed in the magnetic pole 12.

The magnetic pole 11 can have a receiving hole 111 (i.e., an accommodating hole) for receiving/accommodating the optical positioning element 15. In a first embodiment, referring to FIGS. 2A and 2B, the receiving hole 111 is cylindrical and hollowed out. The receiving hole 111 has a diameter D11 at one end of the magnetic pole 11 having the diameter D1, and penetrates through the magnetic pole 11 so as to have a diameter D12 at the other end of the magnetic pole 11 having the diameter D2. The diameter D11 is equal to the diameter D12, and (another inequality) the diameter D1≥diameter D2≥diameter D11=diameter D12. The receiving hole 111 penetrates through the magnetic pole 11 in a direction perpendicular to the element 2 to be tested, and two ends of the receiving hole 111 are exposed from the magnetic pole 11. That is, the two ends have openings. In a second embodiment, referring to FIGS. 3A and 3B, the receiving hole 111 can be conical and hollowed out. For example, the receiving hole 111 gradually decreases from a diameter D11 of 30 mm to a diameter D12 of 5 mm. The diameter D11 is greater than the diameter D12, and (another inequality) the diameter D1≥diameter D2≥diameter D12, and (still another inequality) the diameter D1≥diameter D11>diameter D12. In a third embodiment, referring to FIGS. 4A and 4B, the receiving hole 111 can be stepped-cylindrical formed by a plurality of cylindrical structures 1111, 1112, 1113 with at least a step 112, 113 (step difference) and hollowed out. For example, the receiving hole 111 has a stack structure formed by a cylindrical structure 1113 with a diameter D11 of 30 mm (close to the end of the magnetic pole 11 having the diameter D1), a cylindrical structure 1112 with a diameter D13 of 10 mm, and a cylindrical structure 1111 with a diameter D12 of 5 mm (close to the end of the magnetic pole 11 having the diameter D2). The cylindrical structure 1112 with the diameter D13 is positioned between the cylindrical structure 1113 with the diameter D11 and the cylindrical structure 1111 with the diameter D12, and the diameter D1>diameter D11>diameter D13>diameter D12, and (another inequality) the diameter D1≥diameter D2>diameter D12. Since the receiving hole 111 can be cylindrical, conical or stepped-cylindrical formed by a plurality of cylindrical structures 1111, 1112, 1113 with at least a step 112, 113, or a combination thereof, the receiving hole 111 can be implemented according to the size of the optical positioning element 15 so as to be flexible in configuration.

In FIGS. 2A to 4B, the receiving hole 111 penetrates through the magnetic pole 11 and the two ends of the receiving hole 111 are exposed from the magnetic pole 11. That is, the two ends of the receiving hole 111 have openings. But in fourth to sixth embodiments of FIGS. 8A to 10B, only one end of the receiving hole 111' is exposed from the magnetic pole 11 (i.e., having an opening), and the other end of the receiving hole 111' is positioned inside the magnetic pole 11 and not exposed from the magnetic pole 11 (i.e., being sealed). In the fourth embodiment, referring to FIGS. 8A and 8B, the receiving hole 111' is cylindrical and hollowed out. One end of the receiving hole 111' is exposed from the end of the magnetic pole 11 with the diameter D2 and has a diameter D12, but the other end of the receiving hole 111' is not exposed from the other end of the magnetic pole 11 with the diameter D1. Instead, it is formed inside the magnetic pole 11. The diameter D11 is equal to the diameter D12, and (another inequality) the diameter D1≥diameter D2≥diameter D11=diameter D12. In the fifth embodiment, referring to FIGS. 9A and 9B, the receiving hole 111' can be conical and hollowed out. For example, the receiving hole 111' gradually increases from diameter D12 (e.g., 5 mm) to diameter D11'. Since the receiving hole 111' is exposed from the end of the magnetic pole 11 with the diameter D2 and has the diameter D12 (having an opening), but not exposed at the other end of the magnetic pole 11 with the diameter D1 (being sealed), the diameter D11' can be determined by the position of the receiving hole 111' inside the magnetic pole 11. For instance, the diameter D11' can be less than the diameter D11 (i.e., less than 30 mm) of the second embodiment, and the diameter D11' is greater than the diameter D12, i.e., the diameter D1≥diameter D2≥diameter D12, and (another inequality) the diameter D1>diameter D11'>diameter D12. In the sixth embodiment, referring to FIGS. 10A and 10B, the receiving hole 111' can be stepped-cylindrical formed by a plurality of cylindrical structures 1111', 1112', 1113' with at least one step 112, 113 (step difference) and hollowed out. For example, the receiving hole 111' has a stack structure formed by a cylindrical structure 1113' with a diameter D11 of 30 mm (close to the end of the magnetic pole 11 having the diameter D1), a cylindrical structure 1112' with a diameter D13 of 10 mm and a cylindrical structure 1111' with a diameter D12 of 5 mm (close to the end of the magnetic pole 11 having the diameter D2). The cylindrical structure 1112' with the diameter D13 is positioned between the cylindrical structure 1113' with the diameter D11 and the cylindrical structure 1111' with the diameter D12. The cylindrical structure 1111' is exposed at the end of the magnetic pole 11 having the diameter D2 and has a diameter D12 (i.e., the receiving hole 111' has an opening at one end), but the cylindrical structure 1113' is not exposed at the end of the magnetic pole 11 having the diameter D1 (i.e., the other end of the receiving hole 111' is sealed). Further, the diameter D1>diameter D11>diameter D13>diameter D12, and (another inequality) the diameter D1≥diameter D2>diameter D12.

In an embodiment, referring to FIG. 1B, the optical positioning element 15 can be, but not limited to, a microscope, a photo camera, a video camera, a photosensitive charge-coupled device (CCD), or a complementary metal oxide semiconductor device (CMOS). Further, the optical positioning element 15 has an optical axis perpendicular to a surface of the element 2 to be tested so as to facilitate precise positioning without causing an angular parallax. In another embodiment, the optical axis 151 of the optical positioning element 15 can be parallel to or overlapping with a magnetic axis 114 of the magnetic pole 11, but the present disclosure is not limited thereto.

By forming a receiving hole in a magnetic pole so as to receive an optical positioning element, the magnetic field structure of the present disclosure can simultaneously provide a strong magnetic field and precise positioning of a probe, thereby facilitating precise alignment of a probe and fast magnetic dynamic detection. The following comparative examples and embodiments are provided to verify the above-described functions and effects of the present disclosure.

Comparative example 1 is a general magnetic field structure without an optical positioning element (or a receiving hole). As an example, the magnetic pole has a diameter gradually decreasing from 60 mm to 10 mm, the coil has 2000 turns and the current is 4 A (Ampere). Comparative example 1 generates a magnetic field of 1.1 T (Tesla).

Comparative example 2 is a general magnetic field structure having a single magnetic pole. As an example, the diameter of the magnetic pole decreases gradually from 60 mm to 10 mm, the coil has 2000 turns and the current is 4 A. Comparative example 2 generates a magnetic field of 0.47 T. When the current is 5 A, 6 A, 7 A, 8 A and 9 A, the magnetic field is 0.57 T, 0.66 T, 0.74 T, 0.79 T and 0.83 T, respectively. Even if the current is increased to 10 A, the magnetic field can only reach 0.87 T, which is difficult to reach more than 1 T.

Figure 2A:
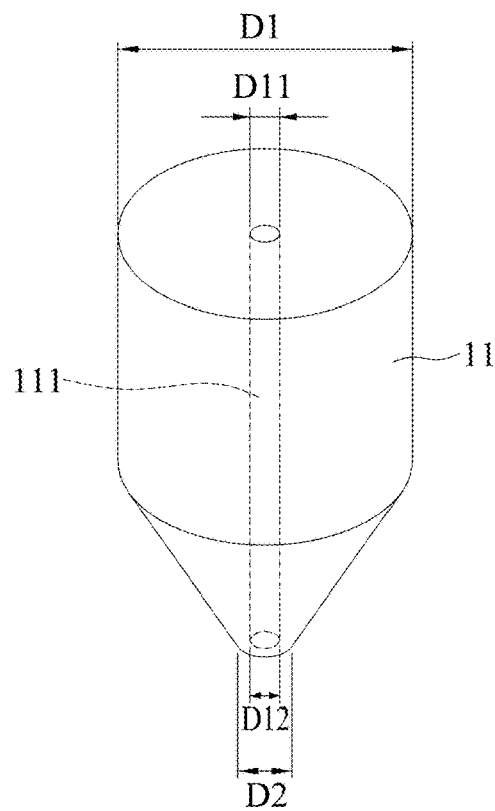
FIG. 2A is a schematic perspective view of a magnetic pole in the magnetic field structure according to a first embodiment of the present disclosure.
Figure 2B:
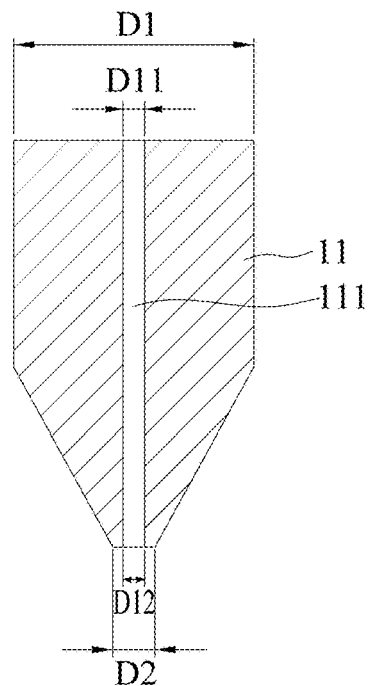
FIG. 2B is a schematic cross-sectional view of the magnetic pole of FIG. 2A.
Figure 5A:
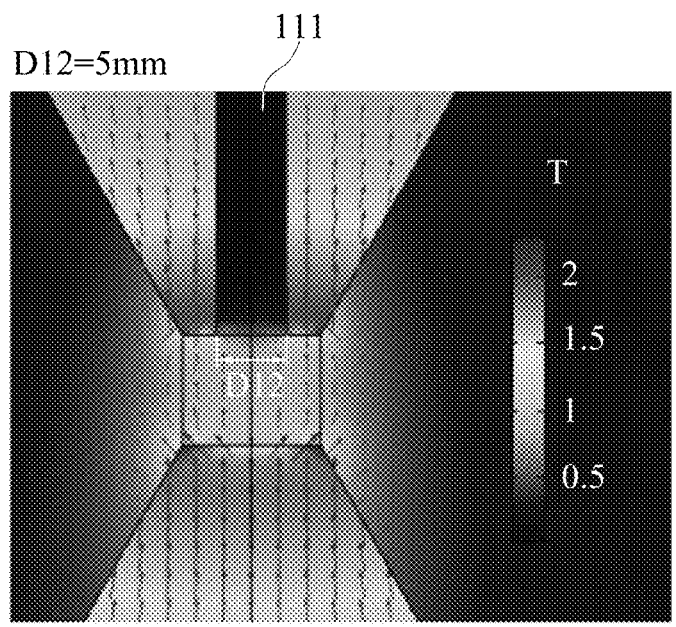
FIGS. 5A and 5B are diagrams showing magnetic field simulation analyses of different embodiments of the magnetic pole of FIGS. 2A and 2B.
Figure 5B:
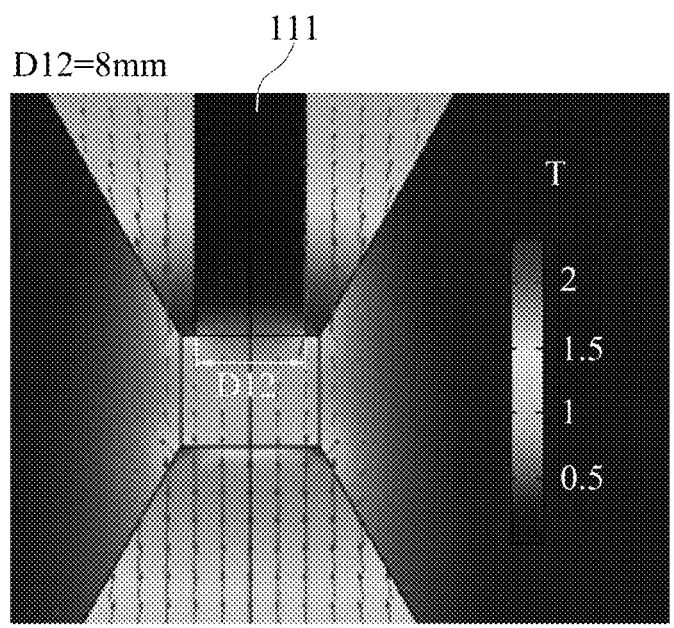

The first embodiment has the same structure and setting parameters as comparative example 1 except that the magnetic pole 11 has a receiving hole 111 for receiving the optical positioning element 15, as shown in FIGS. 1A and 1B. Referring to FIGS. 2A and 2B, the receiving hole 111 can be cylindrical. Further referring to FIGS. 5A and 5B, when the diameter D12 of the receiving hole 111 is 5 mm, the magnetic field is 1.07 T, and when the diameter D12 of the receiving hole 111 is 8 mm, the magnetic field is 0.98 T. In other embodiments, when the diameter D12 of the receiving hole 111 is 6 mm, 7 mm, 9 mm and 10 mm, the magnetic field is 1.05 T, 1.02 T, 0.94 T and 0.89 T, respectively. Therefore, the increase of the diameter D12 will cause magnetic saturation of the material at the front end of the magnetic pole 11, thereby reducing the magnetic field. In an embodiment, the diameter D12 of the receiving hole 111 of the present disclosure is less than or equal to 8 mm, but the present disclosure is not limited thereto.

Figure 3A:
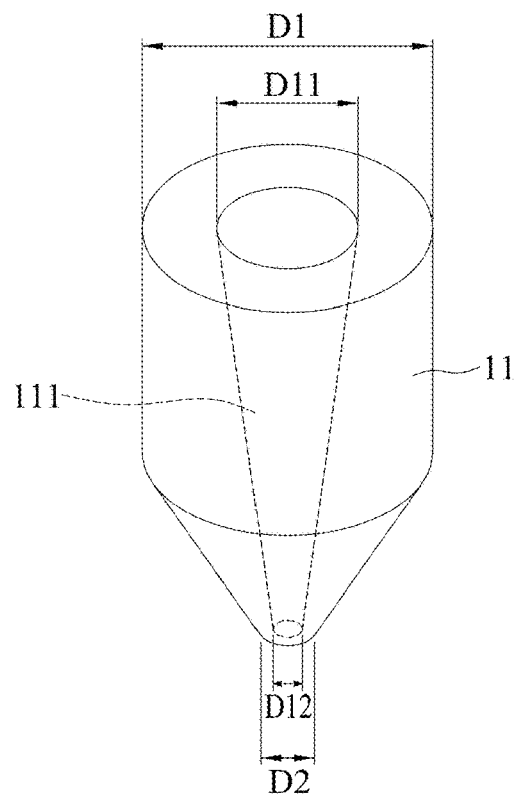
FIG. 3A is a schematic perspective view of a magnetic pole in the magnetic field structure according to a second embodiment of the present disclosure.
Figure 3B:
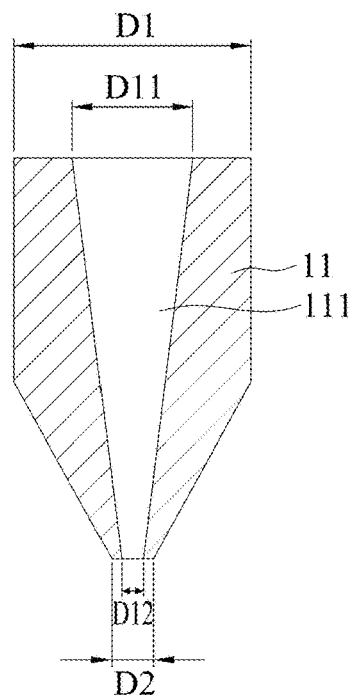
FIG. 3B is a schematic cross-sectional view of the magnetic pole of FIG. 3A.
Figure 6A:
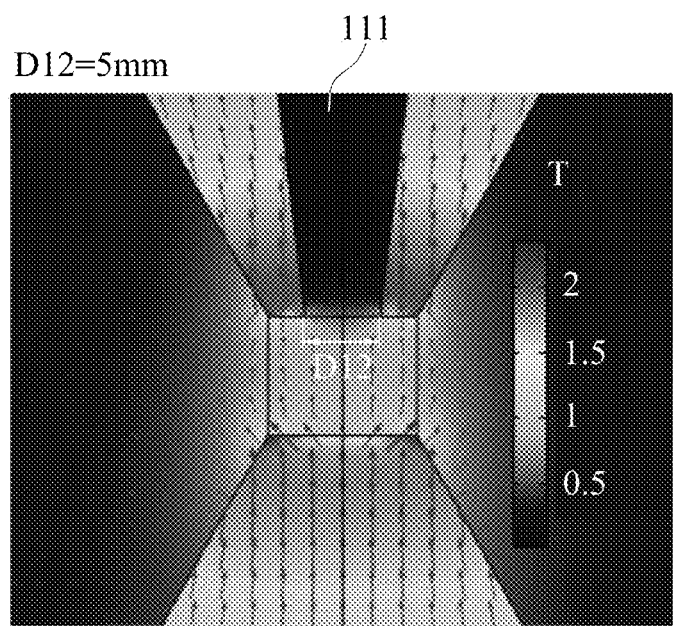
FIGS. 6A and 6B are diagrams showing magnetic field simulation analyses of different embodiments of the magnetic pole of FIGS. 3A and 3B.
Figure 6B:
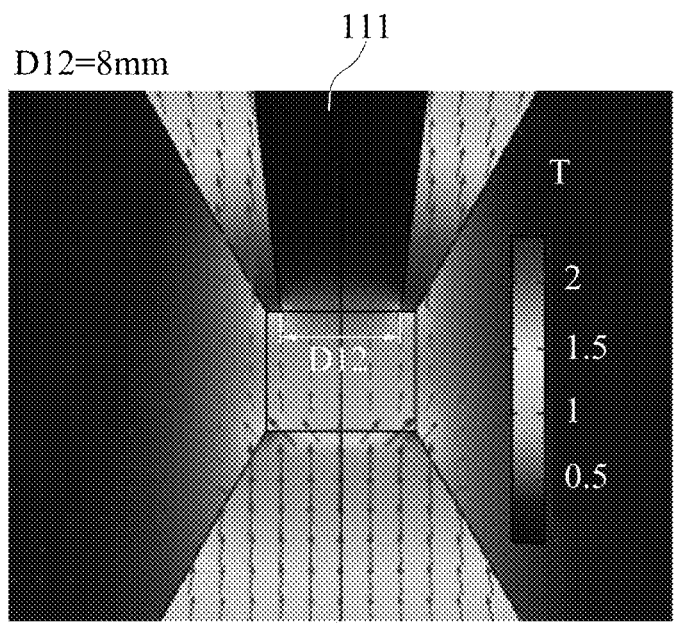

The second embodiment has the same structure and setting parameters as the first embodiment except that the receiving hole 111 is conical, as shown in FIGS. 3A and 3B. Further referring to FIGS. 6A and 6B, when the diameter D11 of the receiving hole 111 is 30 mm and the diameter D12 is 5 mm, the magnetic field is 1.06 T. When the diameter D11 of the receiving hole 111 is 33 mm and the diameter D12 is 8 mm, the magnetic field is 0.96 T. In other embodiments, when the diameter D11 of the receiving hole 111 is 31 mm and the diameter D12 is 6 mm, the magnetic field is 1.03 T. When the diameter D11 of the receiving hole 111 is 32 mm and the diameter D12 is 7 mm, the magnetic field is 1.00 T. When the diameter D11 of the receiving hole 111 is 34 mm and the diameter D12 is 9 mm, the magnetic field is 0.91 T. When the diameter D11 of the receiving hole 111 is 35 mm and the diameter D12 is 10 mm, the magnetic field is 0.86 T. Therefore, the increase of the diameter D12 will cause magnetic saturation of the material at the front end of the magnetic pole 11, thereby reducing the magnetic field.

Figure 4A:
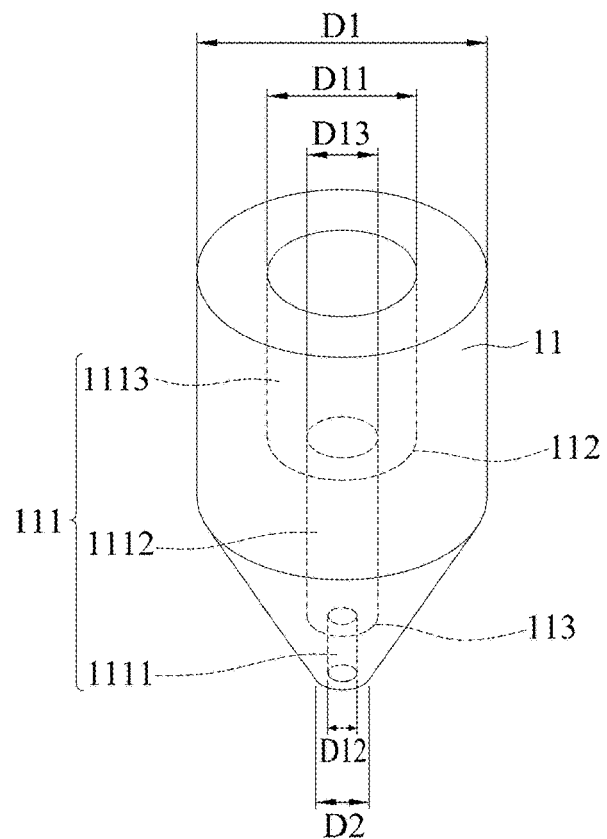
FIG. 4A is a schematic perspective view of a magnetic pole in the magnetic field structure according to a third embodiment of the present disclosure.
Figure 4B:
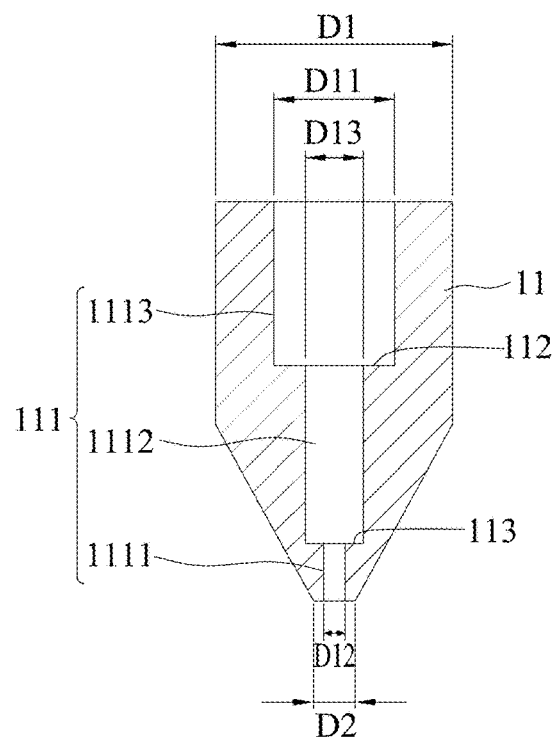
FIG. 4B is a schematic cross-sectional view of the magnetic pole of FIG. 4A.
Figure 7A:
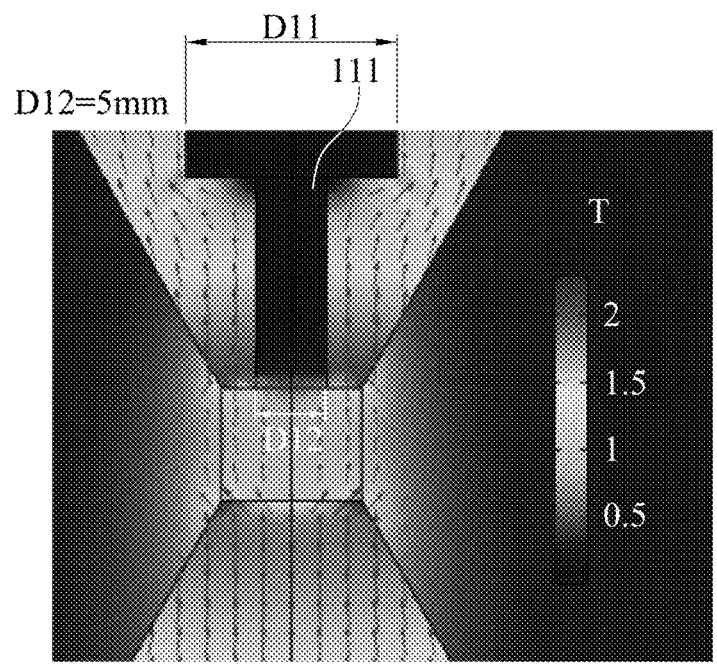
FIGS. 7A and 7B are diagrams showing magnetic field simulation analyses of different embodiments of the magnetic pole of FIGS. 4A and 4B.
Figure 7B:
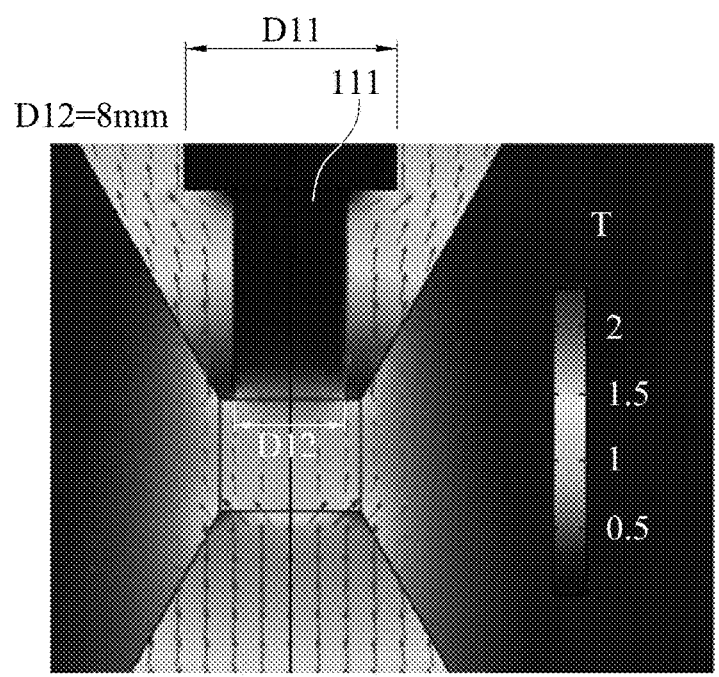

The third embodiment has the same structure and setting parameters as the first embodiment except that the receiving hole 111 is stepped-cylindrical formed by a plurality of cylindrical structures 1111, 1112, 1113 with at least one step 112, 113, as shown in FIGS. 4A and 4B. The diameter D11 of the cylindrical structure 1113 of the receiving hole 111 is 30 mm and the diameter D13 of the cylindrical structure 1112 is 15 mm. Further referring to FIGS. 7A and 7B, when the diameter D12 of the cylindrical structure 1111 of the receiving hole 111 is 5 mm, the magnetic field is 1.07 T. When the diameter D12 of the cylindrical structure 1111 of the receiving hole 111 is 8 mm, the magnetic field is 0.98 T. In other embodiments, when the diameter D12 of the cylindrical structure 1111 of the receiving hole 111 is 6 mm, 7 mm, 9 mm and 10 mm, the magnetic field is 1.05 T, 1.02 T, 0.94 T and 0.89 T, respectively. Therefore, the increase of the diameter D12 will cause magnetic saturation of the material at the front end of the magnetic pole 11, thereby reducing the magnetic field.

Figure 8A:
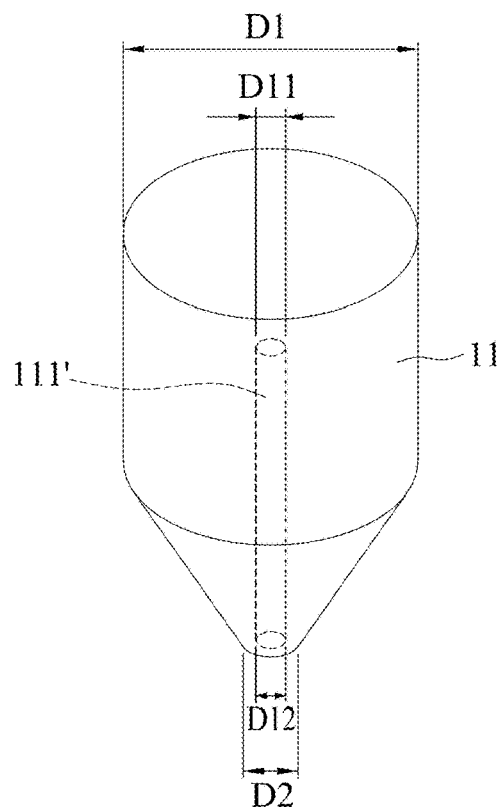
FIG. 8A is a schematic perspective view of a magnetic pole in the magnetic field structure according to a fourth embodiment of the present disclosure.
Figure 8B:
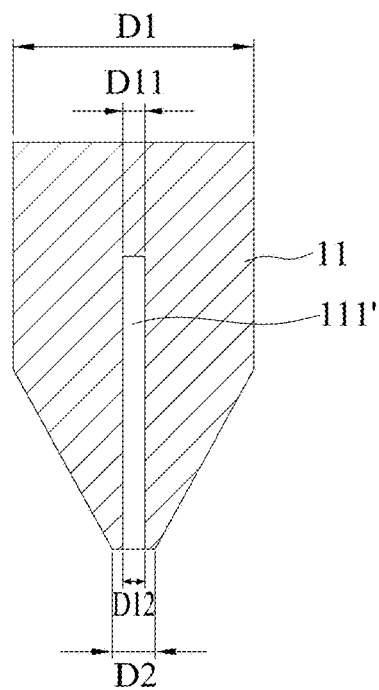
FIG. 8B is a schematic cross-sectional view of the magnetic pole of FIG. 8A.

The fourth embodiment has the same structure and setting parameters as the first embodiment except that one end of the receiving hole 111' is not exposed from the magnetic pole 11, as shown in FIGS. 8A and 8B. When the diameter D12 of the receiving hole 111' is 5 mm, the magnetic field is 1.07 T. When the diameter D12 of the receiving hole 111' is 8 mm, the magnetic field is 0.98 T. In other embodiments, when the diameter D12 of the receiving hole 111' is 6 mm, 7 mm, 9 mm and 10 mm, the magnetic field is 1.05 T, 1.02 T, 0.94 T and 0.89 T, respectively. Therefore, the increase of the diameter D12 will cause magnetic saturation of the material at the front end of the magnetic pole 11 and hence reduce the magnetic field. However, whether the receiving hole 111' penetrates through the magnetic pole 11 or not does not significantly affect the change of the magnetic field. In an embodiment, the diameter D12 of the receiving hole 111 is less than or equal to 8 mm, but the present disclosure is not limited thereto.

Figure 9A:
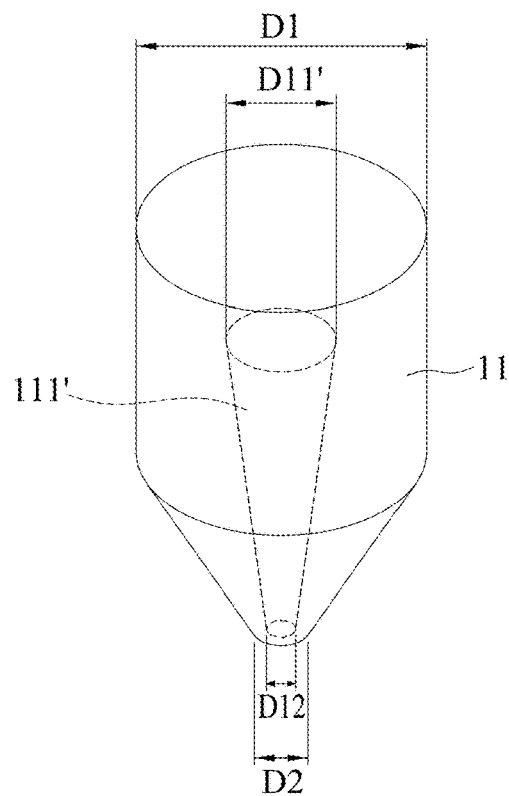
FIG. 9A is a schematic perspective view of a magnetic pole in the magnetic field structure according to a fifth embodiment of the present disclosure.
Figure 9B:
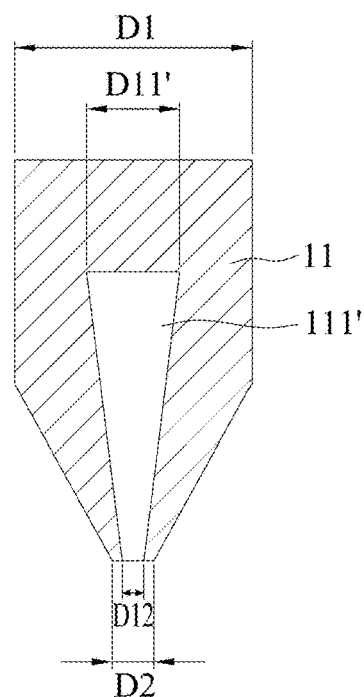
FIG. 9B is a schematic cross-sectional view of the magnetic pole of FIG. 9A.

The fifth embodiment has the same structure and setting parameters as the second embodiment except that one end of the receiving hole 111' is not exposed from the magnetic pole 11, and the receiving hole 111' shown in FIGS. 9A and 9B is conical. When the diameter D12 of the receiving hole 111' is 5 mm, 6 mm, 7 mm, 8 mm, 9 mm and 10 mm, the magnetic field is 1.06 T, 1.04 T, 1.00 T, 0.96 T, 0.91 T and 0.86 T, respectively. Therefore, the increase of the diameter D12 will cause magnetic saturation of the material at the front end of the magnetic pole 11 and hence reduce the magnetic field. However, whether the receiving hole 111' penetrates through the magnetic pole 11 or not does not significantly affect the change of the magnetic field.

Figure 10A:
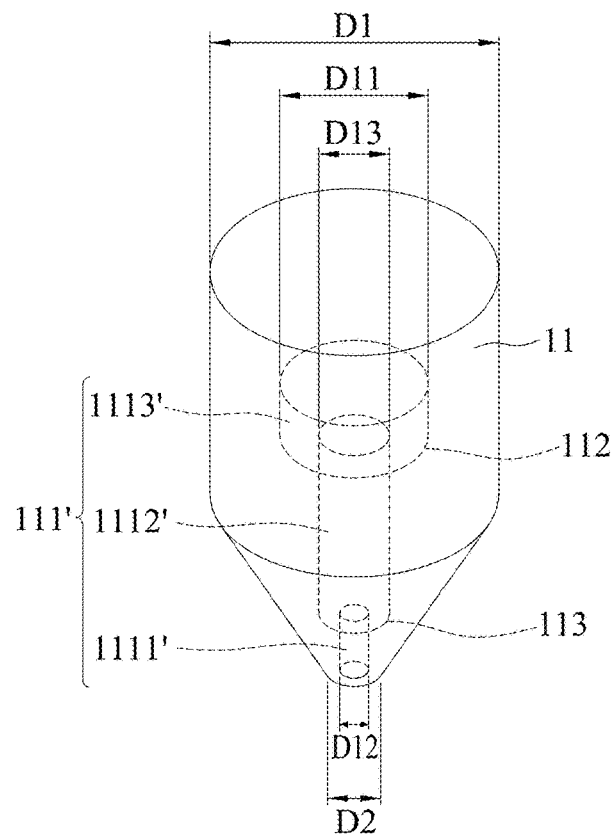
FIG. 10A is a schematic perspective view of a magnetic pole in the magnetic field structure according to a sixth embodiment of the present disclosure.
Figure 10B:
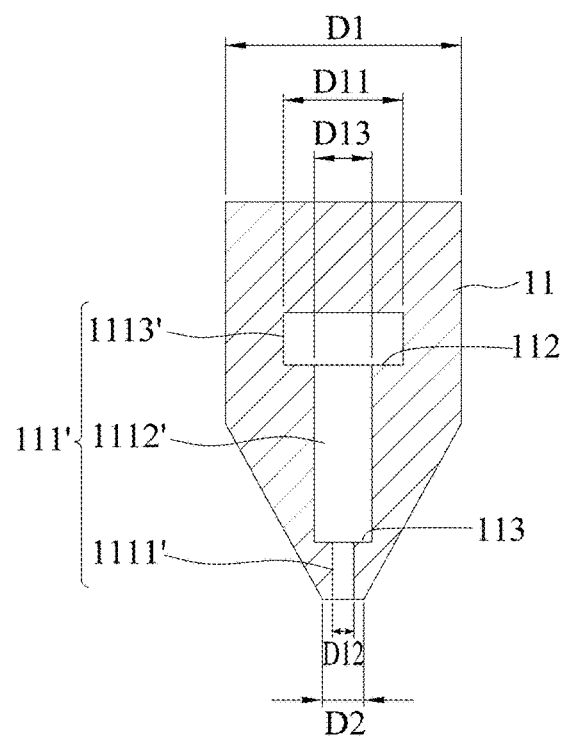
FIG. 10B is a schematic cross-sectional view of the magnetic pole of FIG. 10A.

The sixth embodiment has the same structure and setting parameters as the third embodiment except that the cylindrical structure 1113' of the receiving hole 111' is not exposed from the magnetic pole 11, as shown in FIGS. 10A and 10B. When the diameter D12 of the cylindrical structure 1111' of the receiving hole 111' is 5 mm, 6 mm, 7 mm, 8 mm, 9 mm and 10 mm, the magnetic field is 1.07 T, 1.05 T, 1.02 T, 0.98 T, 0.94 T and 0.89 T, respectively. Therefore, the increase of the diameter D12 will cause magnetic saturation of the material at the front end of the magnetic pole 11 and hence reduce the magnetic field. However, whether the receiving hole 111' penetrates through magnetic pole 11 or not does not significantly affect the change of magnetic field.

Therefore, it can be known from the results of the aforementioned comparative example 1, comparative example 2 and the first to sixth embodiments that although the magnetic field of comparative example 1 can reach 1.1 T, since no optical positioning element is provided, precise positioning cannot be achieved. In comparative example 2, although an optical positioning element can be provided due to a single magnetic pole, the magnetic field, however, is too low. Compared with the comparative example 1, the receiving hole 111 formed in the magnetic pole 11 according to the first embodiment may affect the magnetic field. However, by controlling the diameter D12 of the receiving hole 111, the magnetic field can be maintained at a level similar to that of comparative example 1. As such, the present embodiment can provide a strong magnetic field and precise positioning of a probe at the same time. In an embodiment, referring to FIGS. 2A and 2B, the ratio of the diameter D12 of the receiving hole 111 to the diameter D2 of the magnetic pole 11 close to one end of the element 2 to be tested may be less than or equal to 0.8. For example, the diameter D12 of the receiving hole 111 is 8 mm, the diameter D2 of the magnetic pole 11 is 10 mm, and the magnetic field is 0.98 T. In other embodiments, the ratio (D12/D2) is less than or equal to 0.5. For example, the diameter D12 of the receiving hole 111 is 5 mm, the diameter D2 of the magnetic pole 11 is 10 mm, and the magnetic field is 1.07 T. Therefore, even if the magnetic pole 11 has the receiving hole 111 formed therein, the magnetic field structure of the present disclosure can provide a strong magnetic field up to 1 T.

Further, compared with the comparative example 1, the receiving hole 111 of the second and third embodiments can also provide a strong magnetic field up to 1 T. Although the increases of the diameter of the receiving hole 111 of the first to third embodiments causes magnetic saturation of the material at the front end of the magnetic pole and hence reduces the size/strength of the magnetic field, the magnetic field can be maintained above 1 T by increasing the current, as long as the ratio of the diameter of the receiving hole 111 (the diameter D12 of FIGS. 3A to 4B) to the diameter D2 of the magnetic pole 11 close to one end of the element 2 to be tested (D12/D2) is less than or equal to 0.8, but the present disclosure is not limited thereto. In addition, the fourth to sixth embodiments are similar to the first to third embodiments and can provide a strong magnetic field up to 1 T.

The above-described descriptions of the detailed embodiments are to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:
1. A magnetic field structure, comprising:
   two magnetic poles disposed in a magnetic circuit path and opposite to one another to form a space therebetween for receiving an element to be tested, wherein one of the two magnetic poles bas a receiving hole;
   a magnetic field source for providing a magnetic field in the space; and
   an optical positioning element disposed in the receiving hole.
2. The magnetic field structure of claim 1, wherein the receiving hole penetrates through said one of the two magnetic poles in a direction perpendicular to the element to be tested such that two ends of the receiving hole are exposed from said one of the two magnetic poles.
3. The magnetic field structure of claim 1, wherein the receiving hole is located in said one of the two magnetic poles in a direction perpendicular to the element to be tested such that one end of the receiving hole is exposed from said one of the two magnetic poles and the other end of the receiving hole is sealed.
4. The magnetic field structure of claim 1, wherein a ratio of a diameter of the receiving hole to a diameter of one end of the magnetic pole close to the element to be tested is less than or equal to 0.8.
5. The magnetic field structure of claim 4, wherein the ratio is less than or equal to 0.5.
6. The magnetic field structure of claim 1, wherein the receiving hole is cylindrical, conical, or stepped-cylindrical formed by a plurality of cylindrical structures with at least one step, or a combination thereof.
7. The magnetic field structure of claim 1, wherein the two magnetic poles are conical.
8. The magnetic field structure of claim 1, wherein the optical positioning element has an optical axis perpendicular to the element to be tested.
9. The magnetic field structure of claim 1, wherein the optical positioning element has an optical axis parallel to or overlapping with a magnetic axis of said one of the two magnetic poles where the optical positioning element is located in.
10. The magnetic field structure of claim 1, wherein the magnetic field source is an electromagnetic field generated when current flows through a coil, or a permanent magnetic field generated by a permanent magnet.
11. The magnetic field structure of claim 1, wherein the optical positioning element is a microscope, a photo camera, a video camera, a photosensitive charge-coupled device, or a complementary metal oxide semiconductor device.

* * * * *